United States Patent
Andoh et al.

(10) Patent No.: US 6,921,718 B2
(45) Date of Patent: Jul. 26, 2005

(54) SEMICONDUCTOR DEVICE AND METHOD OF MANUFACTURING THE SAME

(75) Inventors: Naoto Andoh, Tokyo (JP); Takao Ishida, Tokyo (JP); Kenji Hosogi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/408,258

(22) Filed: Apr. 8, 2003

(65) Prior Publication Data

US 2004/0067632 A1 Apr. 8, 2004

(30) Foreign Application Priority Data

Oct. 4, 2002 (JP) ....................................... 2002-292815

(51) Int. Cl.⁷ .......................................... H01L 21/311
(52) U.S. Cl. ....................................................... 438/699
(58) Field of Search ................................ 438/702, 700, 438/699, 597, 590, 572, 523, 305, 302, 46, 654, 624, 623, 618, 600, 461, 240, 637, 471, 396, 381, 253, 127; 257/745, 559, 458, 288, 751, 748, 200, 531, 476, 372, 371, 341, 192

(56) References Cited

U.S. PATENT DOCUMENTS 6,225,651 B1 * 5/2001 Billon ......................... 257/200
6,284,644 B1 * 9/2001 Aug et al. ................... 438/623

FOREIGN PATENT DOCUMENTS

JP          10-64923          3/1998

* cited by examiner

Primary Examiner—Craig A. Thompson
Assistant Examiner—Monica D. Harrison
(74) Attorney, Agent, or Firm—Leydig, Voit & Mayer, Ltd.

(57) ABSTRACT

A semiconductor device includes a semiconductor substrate and an electrode disposed on a major surface of the semiconductor substrate. A via hole is formed on a center of the electrode so as to open from a surface of the electrode to a place under the surface of the semiconductor substrate. A via-hole foundation electrode for inhibiting diffusion from a metal layer is formed inside the via hole and on the surface of the electrode, a via-hole electrode is formed on the surface of the via-hole foundation electrode. A back via hole is formed on the back of the semiconductor substrate opposite to the major surface thereof, and opened from the back of the semiconductor substrate to the via-hole electrode. A back via-hole electrode is formed on the back of the semiconductor substrate including the inside of the back via hole.

8 Claims, 20 Drawing Sheets

(S16~S18)

(S26~S32)

(S34)

(S2)

(S4~S6)

(S8~S10)

(S12)

(S14)

(S16~S18)

(S20~22)

(S24)

(S26~S32)

(S42)

(S44~S50)

(S52)

(S54)

Fig. 19A
Fig. 19B
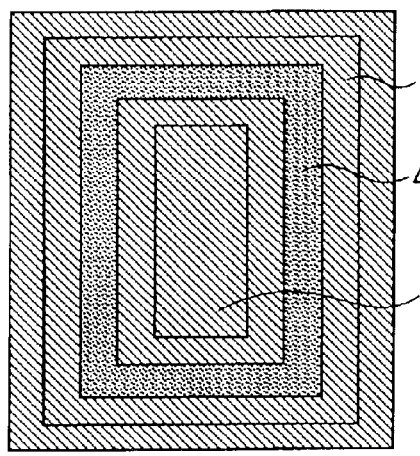
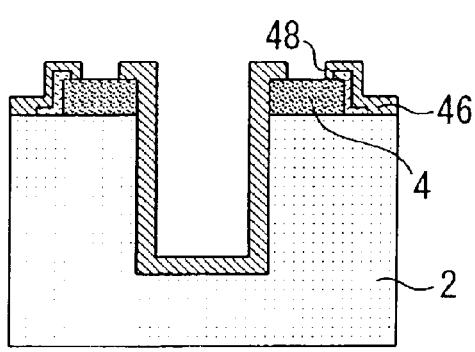
(S56)
Fig. 20A
Fig. 20B
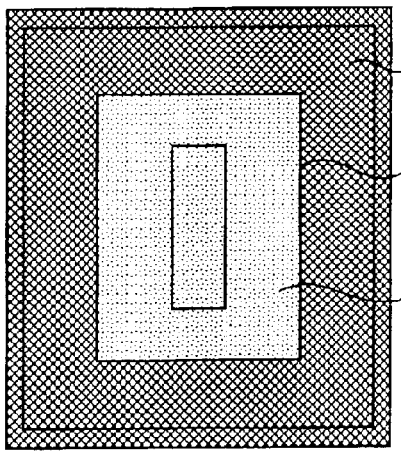
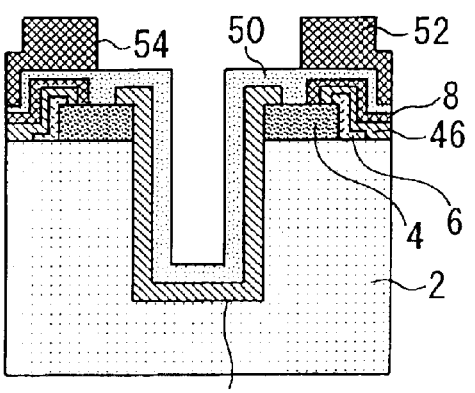
(S58~S62)

Fig. 21A
Fig. 21B
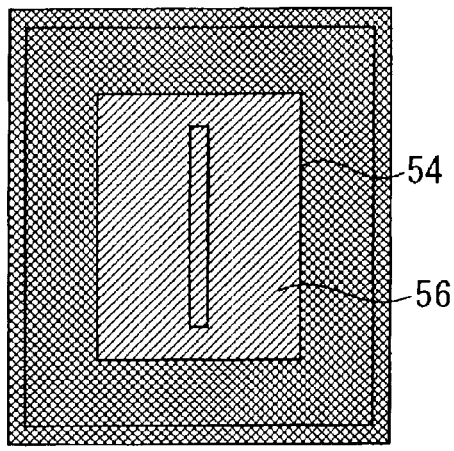
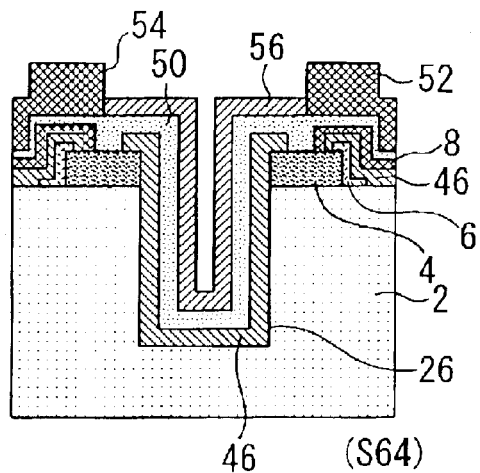
Fig. 22A
Fig. 22B
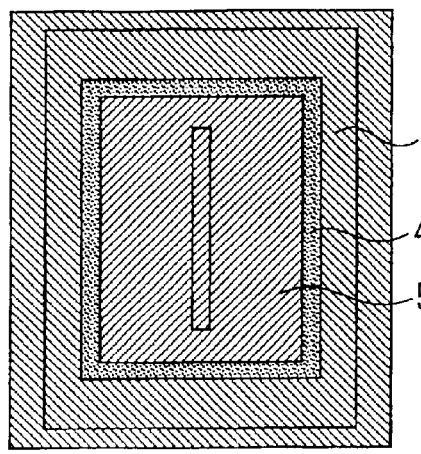
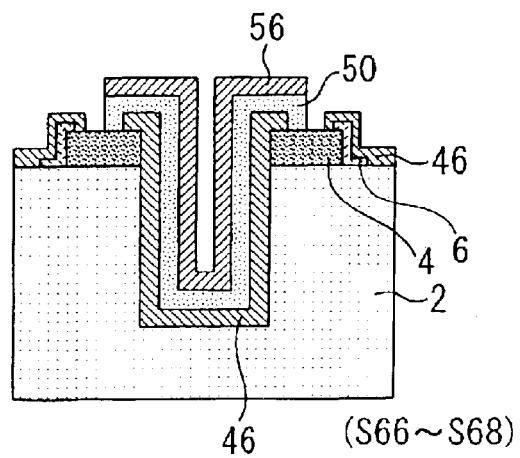

(S70)

(S72)

(S102)

(S104~S108)

(S110~S120)

(S122~S124)

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the semiconductor device.

2. Background Art

FIG. 25 is a flowchart illustrating a method of manufacturing a conventional semiconductor device. FIGS. 26 to 29 are schematic diagrams illustrating steps in the process of manufacturing the conventional semiconductor device 300, FIGS. 26A, 27A, 28A, and 29A being top views, and FIGS. 26B, 27B, 28B, and 29B being sectional views.

A method of manufacturing a conventional semiconductor device 300 will be described below referring to FIGS. 25 to 29.

First, as shown in FIG. 26, ohmic electrodes 74 are formed on a semiconductor substrate 72 (Step S102). Here, a lift-off method is used. Considering the ease of lifting off, the ohmic electrodes 74 are formed in a combination of a C-shape and a reversed C-shape. Also considering the accuracy of mask alignment with electrodes and via holes formed later, the entire width of the ohmic electrodes 74 is controlled to W'.

Next, as FIG. 27 shows, an insulating film 76 is formed on the ohmic electrodes 74 and an exposed surface of the semiconductor substrate 72 (Step S104). Thereafter, contact holes 78 are formed in center portions of the ohmic electrodes 74 (Step S106). Wiring electrodes 80 are formed on the insulating film 76 using the lift-off method or the like so as to bury the contact holes 78 (Step S108). The wiring electrodes 80 have a barrier metal structure.

Next, as shown in FIG. 28, an insulating film 82 is formed on the wiring electrodes 80 and the exposed surface of the insulating film 76 (Step S110). From the insulating film 82, contact holes that open to the wiring electrodes 80 and a contact hole that opens to the portion to form a via hole are formed (Step S112). Thereafter a via hole 86 is formed from the contact hole for the via hole to the semiconductor substrate 72 (Step S114).

Next, a via-hole foundation electrode 88 is formed inside the via hole 86, on the insulating film 82, and on the exposed portion of the wiring electrodes 80 (Step S116). Then, a via-hole electrode 90 is formed on the surface of the via-hole foundation electrode 88 by using electroplating or the like (Step S120).

Next, as shown in FIG. 29, a back via hole 92 is formed (Step S122). The back via hole 92 is opened at a place corresponding to the via hole 86 opened from the surface. Thereafter, a back via-hole electrode 94 is formed on the exposed back surface of the semiconductor substrate 72 including the inside of the back via hole 92 using electroplating or the like (Step S124).

The conventional semiconductor device 300 is formed as described above (see Japanese Patent Laid-Open No. 10-64923, for example).

However, when a semiconductor device 300 is formed by using the method as described above, wiring electrodes 80 having a barrier metal structure must be inserted between the ohmic electrodes 74 and the via-hole electrode 90. For this reason, an additional margin for mask alignment is required. Therefore, there has been a problem that the width of the ohmic electrodes 74 must be increased for this margin resulting in increase in the lateral size of a semiconductor device.

Since a margin for mask alignment is also required between the ohmic electrodes 74 and the via hole 86 opened from the surface, this is also considered to increase the lateral size of a semiconductor device.

SUMMARY OF THE INVENTION

Therefore, an object of the present invention is to provide a semiconductor device and a method of manufacturing the same improved to solve the above-described problems, and to reduce the size of the semiconductor device.

According to one aspect of the present invention, a semiconductor device comprises a semiconductor substrate having a via hole opened to a major surface thereof, an electrode disposed on the major surface of the semiconductor substrate so as to surround an opening of the via hole, a via-hole foundation electrode extending inside the via hole so as to contact the electrode for inhibiting diffusion from the electrode, and a via-hole electrode formed on a surface of the via-hole foundation electrode. Contours of a sidewall of the electrode and a sidewall of the via hole are formed in a straight line.

According to another aspect of the present invention, in a method of manufacturing a semiconductor device, an electrode is formed on a major surface of a semiconductor substrate. A via hole is formed by etching the semiconductor substrate by using the electrode as a part of a mask. A via-hole foundation electrode for inhibiting diffusion is formed from the electrode inside the via hole and on the surface of the electrode. A via-hole electrode is formed on a surface of the via-hole foundation electrode. A back via hole that opens from the back of the semiconductor substrate to the via-hole foundation electrode is formed on the back of the semiconductor substrate opposite to the major surface thereof. Further, a back via-hole electrode is formed on the back of the semiconductor substrate containing an inside of the back via hole.

Other and further objects, features and advantages of the invention will appear more fully from the following description.

BRIEF DESCRIPTION OF THE DRAWINGS

FIGS. 3A to 11B are schematic diagrams illustrating steps of the process of manufacturing a semiconductor device;

FIGS. 17A to 24B are schematic diagrams illustrating steps of a process of manufacturing the semiconductor device;

DETAILED DESCRIPTION OF THE PREFERRED EMBODIMENTS

Figure 1A:
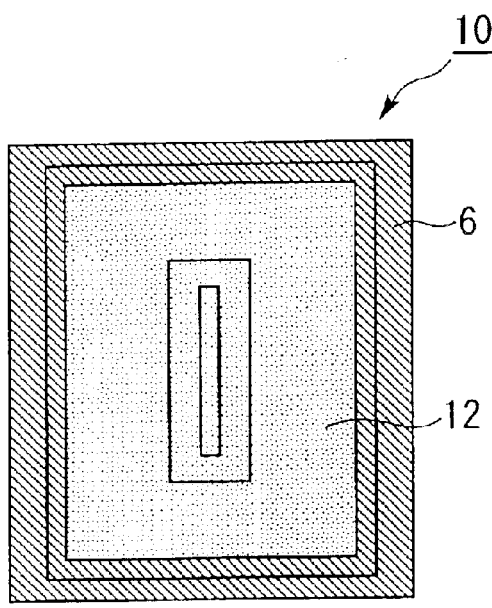
FIGS. 1A and 1B are schematic diagrams illustrating a semiconductor device 100 according to a first embodiment of the present invention.

The embodiments of the present invention will be described below referring to the drawings. In each of the drawings, the same or like parts will be denoted with the same reference numerals, and the description thereof will be simplified or omitted.

First Embodiment

Figure 1B:
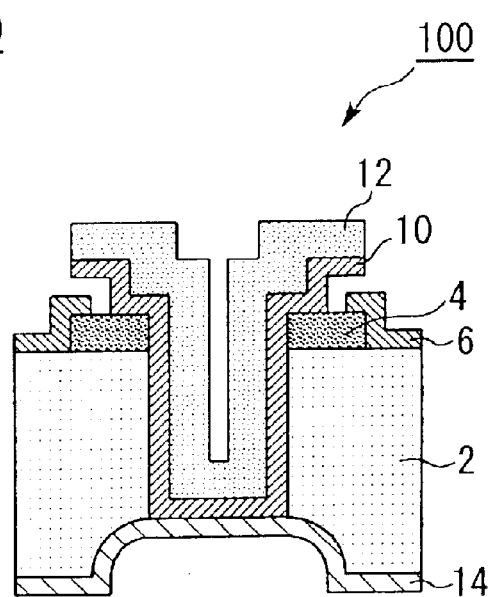

FIG. 1 is a schematic diagram for illustrating a semiconductor device 100 according to a first embodiment of the present invention; FIG. 1A being a top view, and FIG. 1B being a sectional view.

As shown in FIG. 1, the semiconductor device 100 is composed of a semiconductor substrate 2 consisting, for example, of GaAs (gallium arsenide) or the like; an ohmic electrode 4 formed on a major surface of the semiconductor substrate 2; an insulating film 6; a via-hole foundation electrode having a barrier metal 10; a via-hole electrode 12; and a back via-hole electrode 14 formed on the back side of the semiconductor substrate 2.

Figure 2:
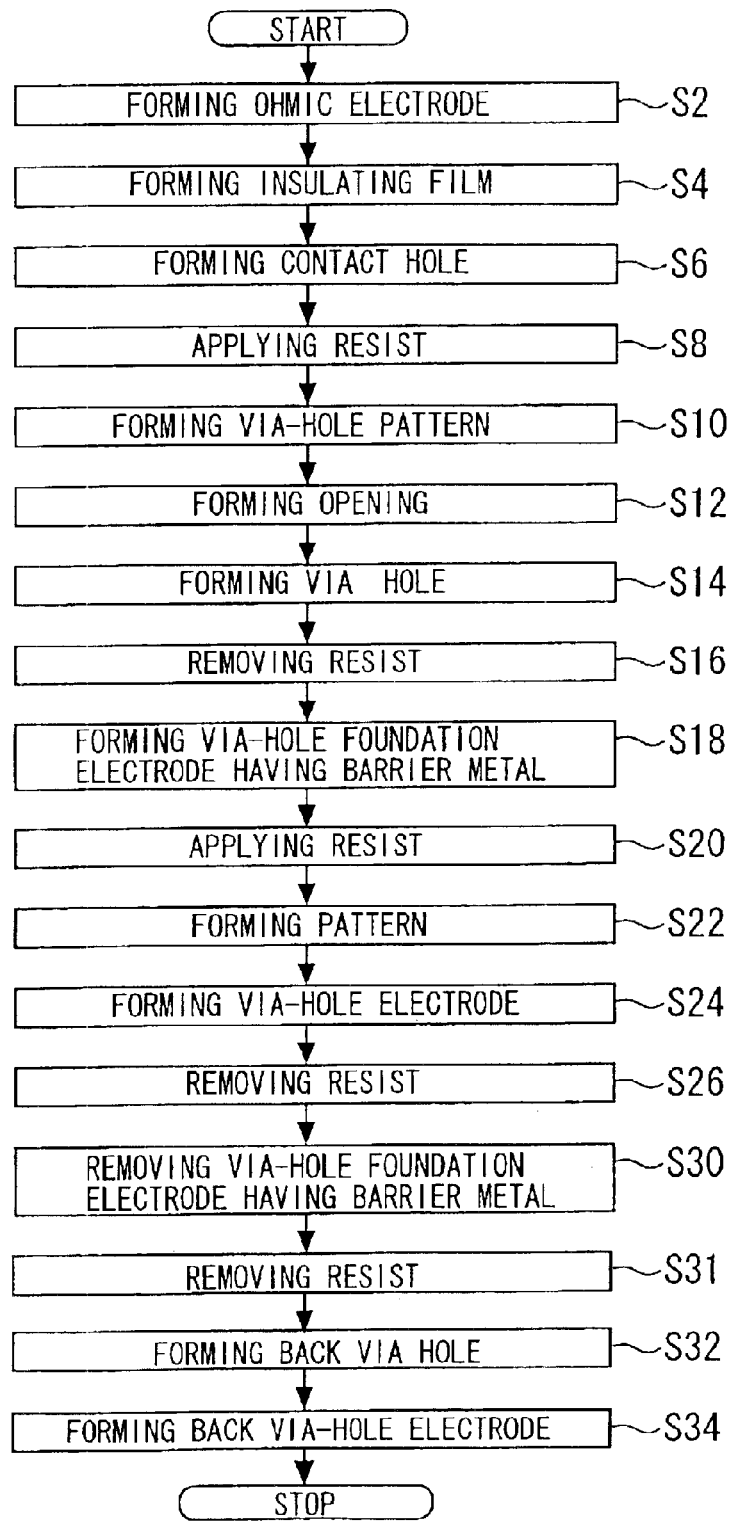
FIG. 2 is a flowchart illustrating a method of manufacturing the semiconductor device 100.
Figure 3A:
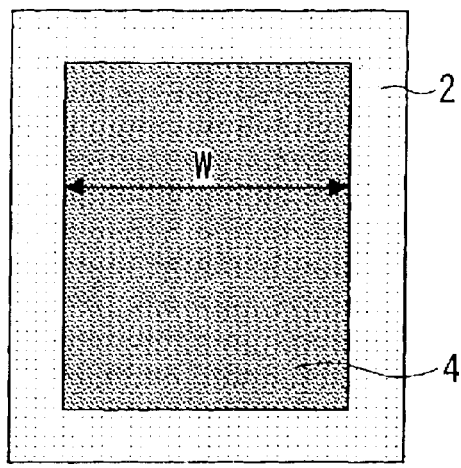
Figure 3B:
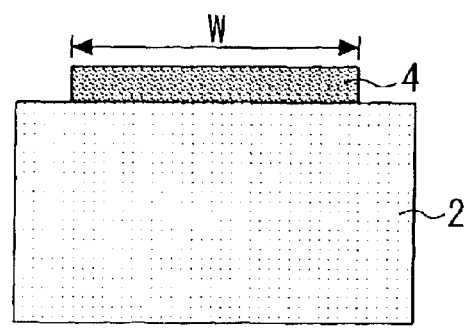

FIG. 2 is a flowchart for illustrating a method of manufacturing the semiconductor device 100. FIGS. 3 to 11 are schematic diagrams for illustrating the steps of the process of manufacturing the semiconductor device 100; FIGS. 3A to 11A being top views, and FIGS. 3B to 11B being sectional views.

The method of manufacturing the semiconductor device 100 will be described below referring to FIGS. 1 to 11.

First, as shown in FIG. 3, an ohmic electrode 4 is formed on the semiconductor substrate 2 (Step S2). Here, the ohmic electrode 4 is formed using a lift-off method in a rectangular shape with a width of W. Specifically, a resist is applied to the semiconductor substrate 2, a pattern for the ohmic electrode is formed on the resist, and then a metal film for the ohmic electrode 4 is formed on the resist. Thereafter, the resist is removed together with the metal film formed on the resist, leaving only the metal film remaining in the opening of the resist. There by,the ohmic electrode 4 is formed.

Figure 4A:
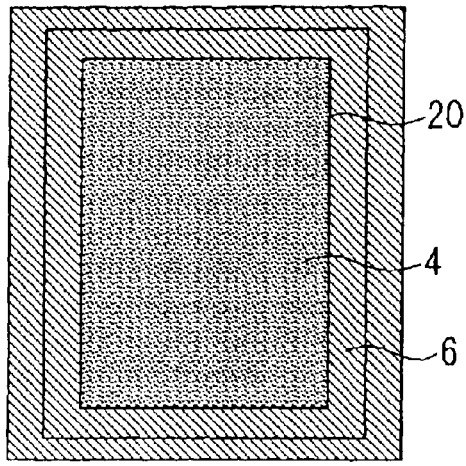
Figure 4B:
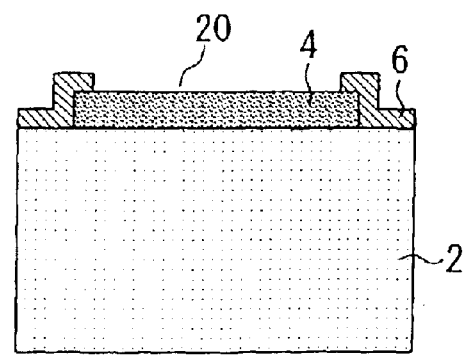

Next, an insulating film 6 is formed on the ohmic electrode 4 (Step S4). Here, CVD (chemical vapor deposition) is used to form the insulating film 6. Thereafter, as shown in FIG. 4, a contact hole 20 is formed in the insulating film 6 (Step S6). The contact hole 20 is formed so as to open from the surface of the insulating film 6 to the center of the surface of the ohmic electrode 4, and so that the surface of the ohmic electrode 4 is exposed at the bottom of the contact hole 20.

Figure 5A:
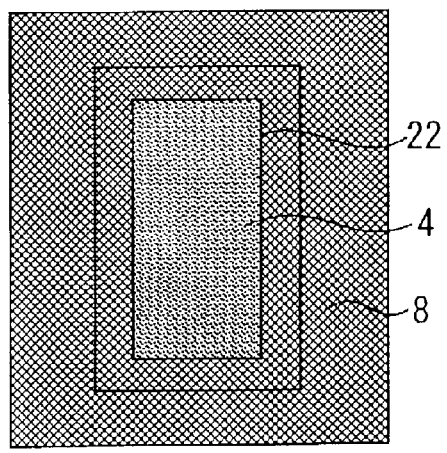
Figure 5B:
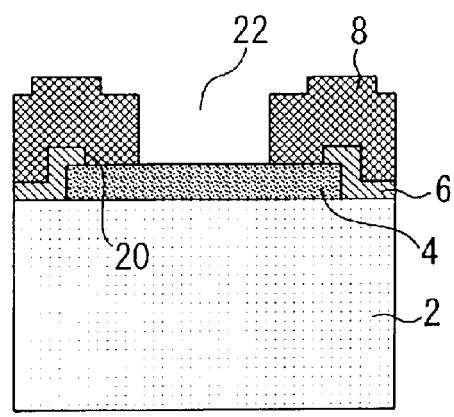

Next, a resist 8 is applied to the surfaces of the ohmic electrode 4 and the insulating film 6 (Step S8). Thereafter, as shown in FIG. 5, a pattern for the via hole 22 is formed on the resist 8 (Step S10). The pattern for the via hole 22 is formed by forming an opening having a diameter smaller than the diameter of the contact hole 20 opened in the insulating film 6, from the surface of the resist 8 to the surface of the ohmic electrode 4.

Figure 6A:
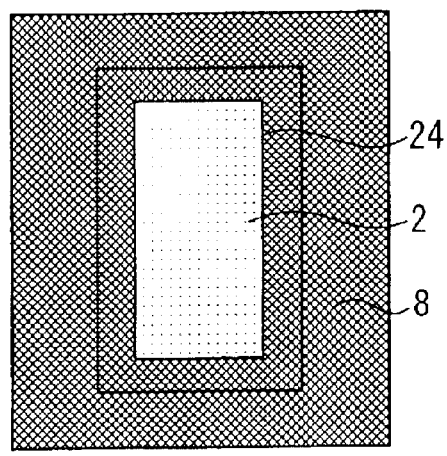
Figure 6B:
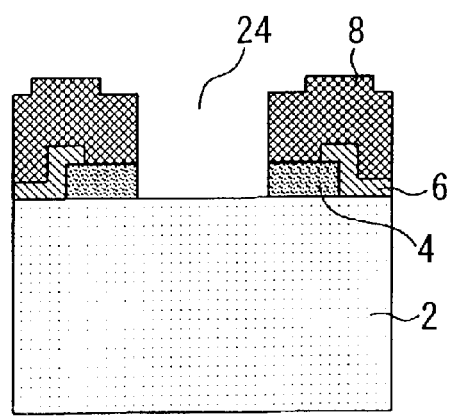

Next, as shown in FIG. 6, an opening 24 is formed in the ohmic electrode 4 (Step S12). Here, the ohmic electrode 4 is subject to dry etching, such as ion trimming, using the pattern for the via hole 22. Dry etching is continued until the surface of the semiconductor substrate 2 is exposed on the surface of the ohmic electrode 4. Thereby, the surface of the semiconductor substrate 2 is exposed on the bottom of the formed opening 24.

Figure 7A:
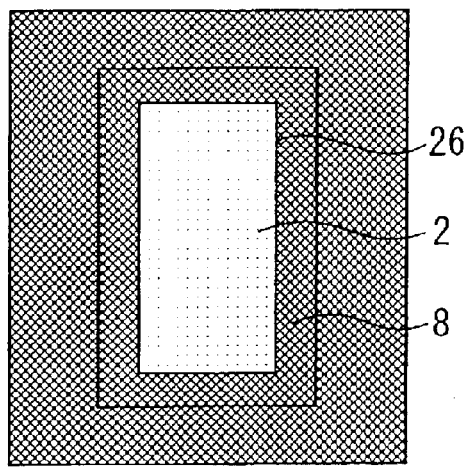
Figure 7B:
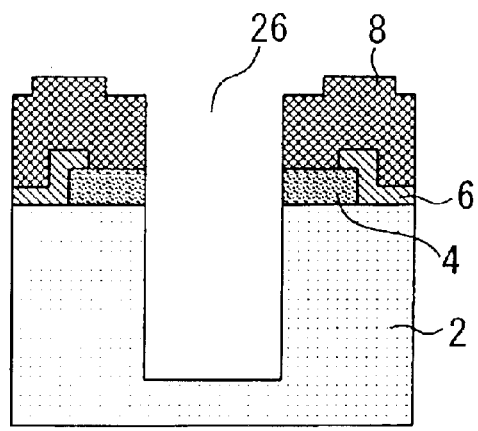

Next, as shown in FIG. 7, a via hole 26 is formed in the semiconductor substrate 2 (Step S14). Here, the semiconductor substrate 2 is subject to RIE (reactive ion etching) using the pattern for the via hole 22. RIE is continued until a predetermined depth of the semiconductor substrate 2 is etched to form the via hole 26. The via hole 26 formed here is a flat opening having a substantially linear sidewall in the cross section thereof that continues in a substantially identical diameter from the surface of the ohmic electrode 4 to the place below the surface of the semiconductor substrate 2.

Figure 8A:
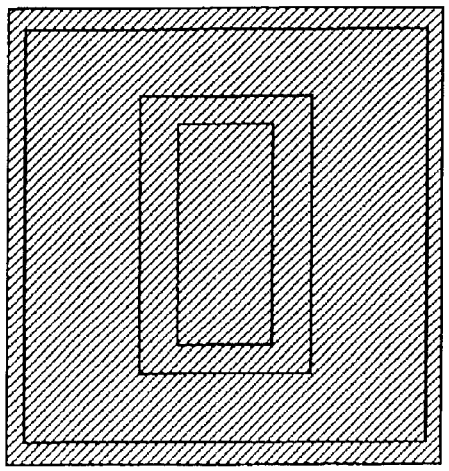
Figure 8B:
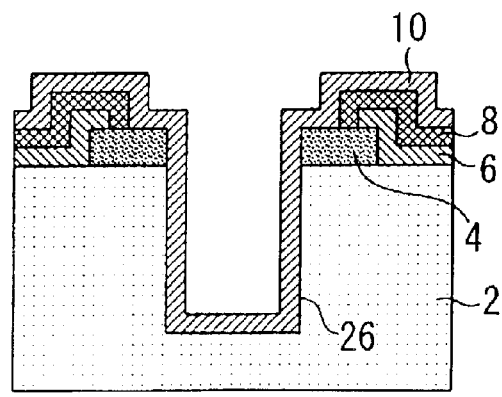

Next, after removing the resist 8 (Step S16), a resist pattern for forming a via-hole foundation electrode having a barrier metal 10 is formed again. In this state, as shown in FIG. 8, a via-hole foundation electrode having a barrier metal 10 is formed (Step S18). Here, the via-hole foundation electrode having a barrier metal 10 is formed on the exposed surfaces of the resist 8 and the ohmic electrode 4, and on the inner wall of the via hole 26. Also, the via-hole foundation electrode having a barrier metal 10 is formed here by first depositing a barrier metal film using WSi or the like, then depositing a foundation electrode film.

Figure 9A:
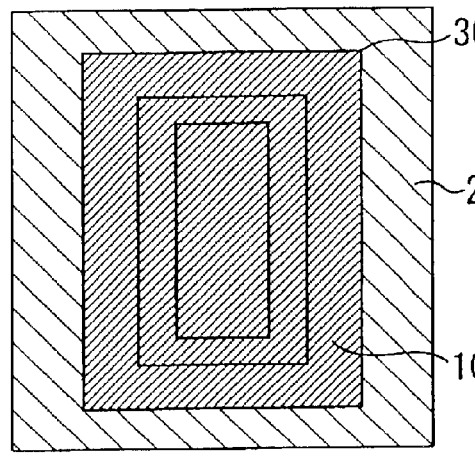
Figure 9B:
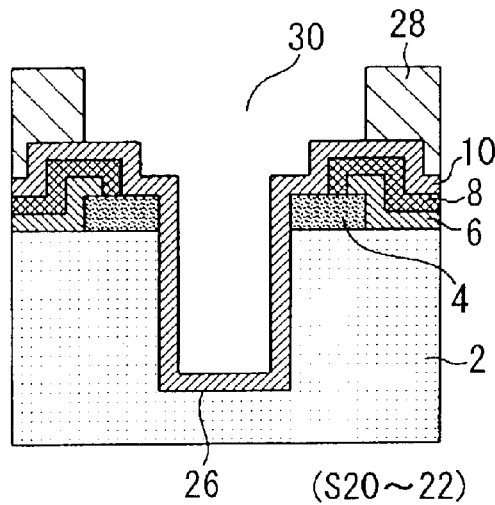

Next, a resist 28 is applied (Step S20). Thereafter, as shown in FIG. 9, a pattern 30 is formed on the resist 28 (Step S22). The pattern 30 is formed so as to surround the circumference of the via-hole foundation electrode having a barrier metal 10 which is exposed on the surface.

Figure 10A:
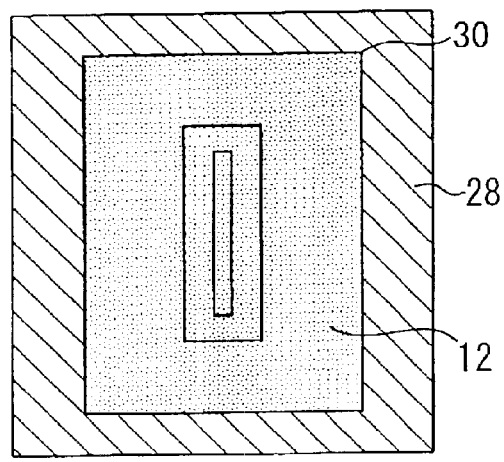
Figure 10B:
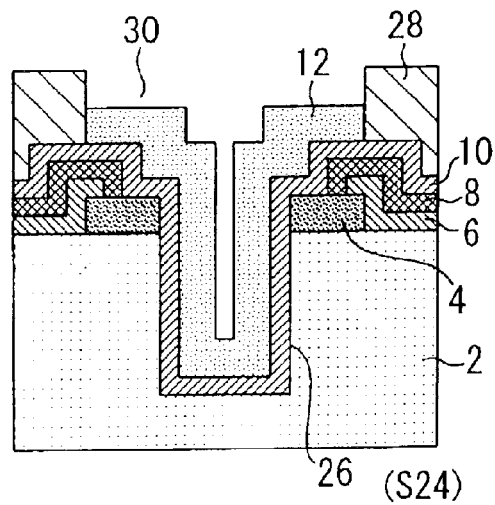
Figures 11A, 11B:
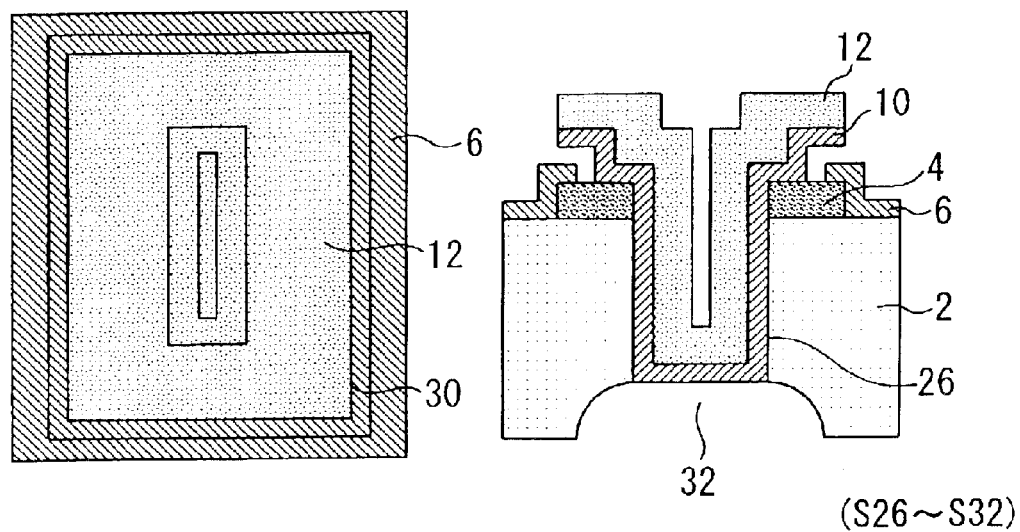

Next, as shown in FIG. 10, a via-hole electrode 12 is formed (Step S24). The via-hole electrode 12 is formed with electrolytic plating so as to contact the inner wall of the opening 30 and the exposed surface of the via-hole foundation electrode having a barrier metal 10 through the opening 30.

Next, the resist 28 is removed (Step S26). Thereafter, the portion of the surface of the via-hole foundation electrode 10 having a barrier metal where the via hole 12 is not formed is removed (Step S30), and the resist is removed. Thereafter, as FIG. 11 shows, a back via hole 32 is formed (Step S32). Here, the back via hole 32 is formed so as to align the position of the via hole 26 opened on the surface of the semiconductor substrate 2. The back via hole 32 is also formed so that the via-hole foundation electrode having a barrier metal 10 on the bottom of the via hole 26 is exposed from the back of the semiconductor substrate 2.

Next, a back via-hole electrode 14 is formed (Step S34). Here, the back via-hole electrode 14 is formed on the entire exposed portion of the back of the semiconductor substrate 2 including the inside of the back via hole 32 by using electrolytic plating. Thereby, the semiconductor device 100 as shown in FIG. 1 is formed.

As described above, in the semiconductor device 100, the via-hole foundation electrode having a barrier metal 10 is used as a via-hole foundation. That is, a via-hole foundation electrode includes a barrier metal. Thereby, since counter diffusion occurring between the ohmic electrode 4 and the via-hole electrode 12 can be prevented, there is no need for forming the wiring electrode of a barrier metal structure. Therefore, since the margin for the mask alignment of the via hole 26 with the ohmic electrode 4 can be omitted, the lateral size of the transistor can be reduced, and the downsizing of the semiconductor device can be achieved.

Also when a via hole is formed in this embodiment, an opening 24 is formed in the ohmic electrode 4 using a resist 8 having the pattern for the via hole as the mask, and the via hole 26 is formed by opening the semiconductor substrate 2 using the resist 8 and the ohmic electrode 4 as the mask. Therefore, there is no step on the boundary between the ohmic electrode 4 and the semiconductor substrate 2, and the via hole 26 having sidewalls whose cross section is a straight line can be formed. Therefore, the size of the via hole 26 can be reduced by the step formed in the via hole 26, and the downsizing of the semiconductor device can be achieved.

Although the methods of forming insulating films and electrode films are described in this embodiment, the present invention is not limited thereto, but the films may be formed by using any suitable methods considering the properties of the films, the thickness of the formed films, or the like. Also in the present invention, the electrodes are not limited to ohmic electrodes.

In the first embodiment, a via-hole foundation electrode having a barrier metal 10 is used as the via-hole foundation electrode, and a barrier metal containing WSi is used as the barrier metal. In the present invention, however, the via-hole foundation electrode is not limited to a via-hole foundation electrode having a barrier metal, but may be any via-hole foundation electrodes as long as counter diffusion from the via-hole electrode 12 and the ohmic electrode can be prevented. Even when a via-hole foundation electrode having a barrier metal is used, the barrier metal is not limited to the one containing WSi, but other barrier metals may also be used.

Second Embodiment

Figure 12:
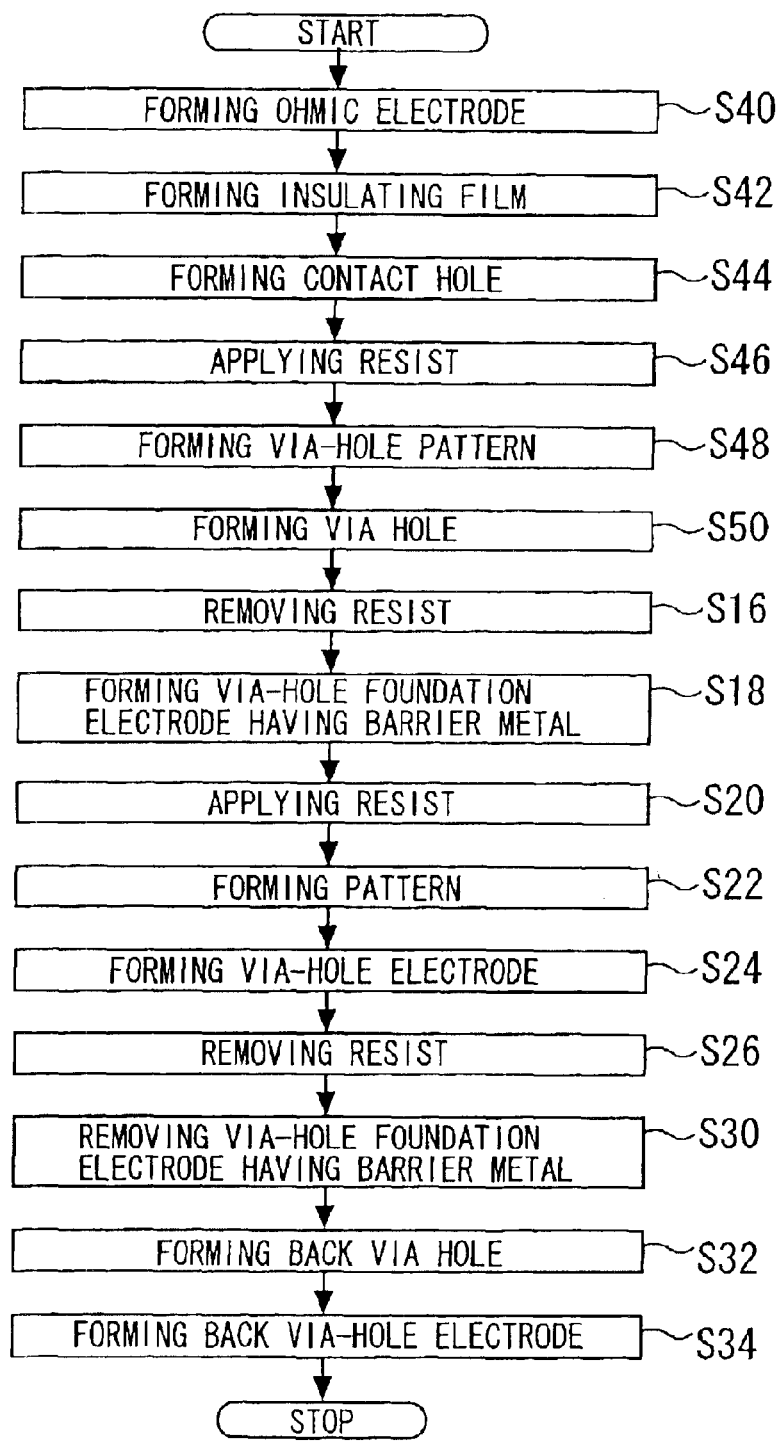
FIG. 12 is a flowchart illustrating a method of manufacturing a semiconductor device 100 according to a second embodiment of the present invention.
Figure 13A:
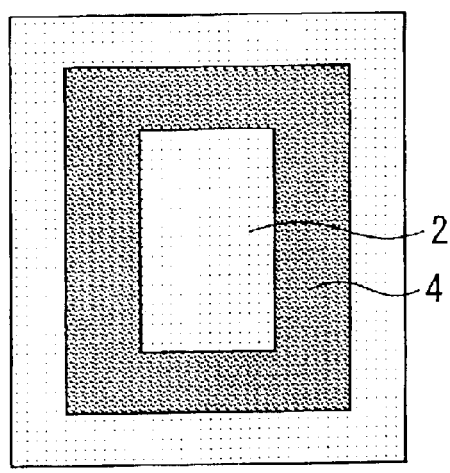
FIGS. 13A to 15B are schematic diagrams illustrating steps of a process of manufacturing a semiconductor device.
Figure 13B:
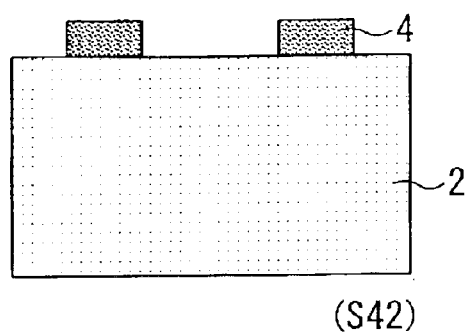
Figure 14A:
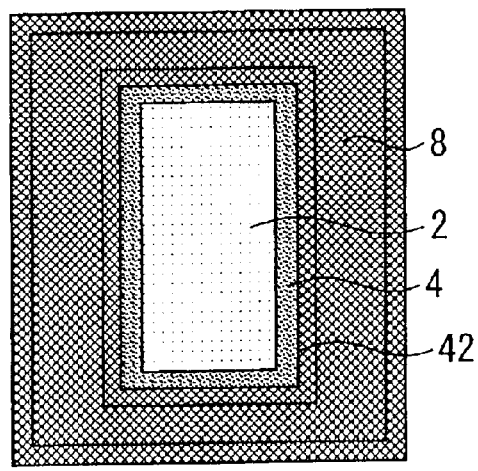
Figure 14B:
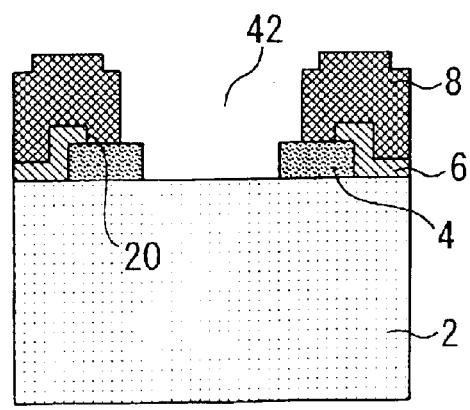
Figure 15A:
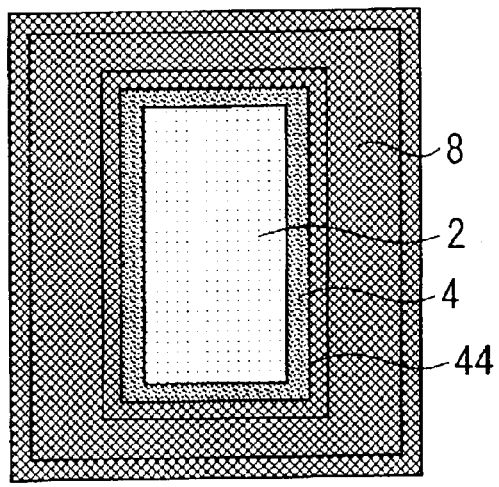
Figure 15B:
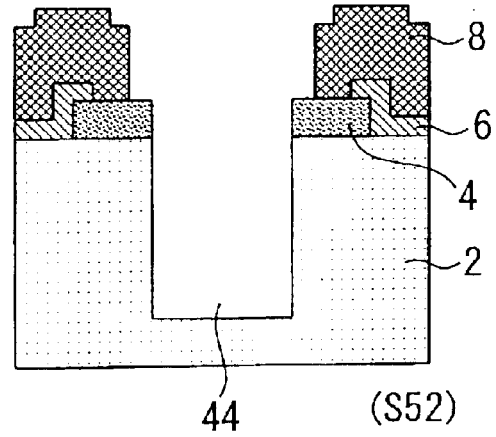

FIG. 12 is a flowchart for illustrating a method of manufacturing a semiconductor device 100 according to a second embodiment of the present invention. FIGS. 13 to 15 are schematic diagrams for illustrating the steps of the process of manufacturing the semiconductor device 100; FIGS. 13A to 15A being top views, and FIGS. 13B to 15B being sectional views.

The method of manufacturing the semiconductor device 200 according to the second embodiment will be described below referring to FIGS. 12 to 15.

First, an ohmic electrode 4 is formed on the semiconductor substrate 2 (Step S40). Here, as shown in FIG. 13, an O-shaped ohmic electrode 4 having an opening in the center thereof is formed by using the tape lift-off method. Specifically, a resist is applied to the semiconductor substrate 2, a pattern for the ohmic electrode is formed on the resist, and then a metal film for the ohmic electrode 4 is formed on the semiconductor substrate 2 and the resist. Thereafter, an adhesive tape is bonded onto the metal film, and only the metal film formed on the resist is removed together with the resist by peeling the adhesive tape off. Thereby, only the metal film remaining in the opening of the resist is left to form the ohmic electrode 4.

Next, an insulating film 6 is formed (Step S42). Thereafter, the insulating film 6 in the vicinity of the circumferential portion of the ohmic electrode 4 is subject to etching to form a contact hole 20 (Step S44). A resist 8 is applied thereon (Step S46), and a vial-hole pattern 42 is formed on the resist 8 (Step S48). Here, as FIG. 14 shows, the opening of the via-hole pattern 42 is formed so as to be about 1 μm larger than the opening of the ohmic electrode 4.

Next, as shown in FIG. 15, a via hole 44 is formed (Step S50). Here, the semiconductor substrate 2 is subject to RIE using the ohmic electrode 4 as the mask. RIE is continued until a predetermined depth is reached to form the via hole 44. The via hole 44 formed here is an opening having a substantially plane sidewall, wherein the diameter thereof is substantially the same from the surface of the ohmic electrode 4 to the place below the surface of the semiconductor substrate 2.

Thereafter, as described in the first embodiment, a via hole is formed in the semiconductor substrate 2; a via-hole foundation electrode having a barrier metal 10 and a via-hole electrode 12 are formed; a back via hole is formed on the back; and a back via-hole electrode 14 is formed (Steps S16 to 32).

Thus, the semiconductor device 100 as shown in FIG. 1, similar to the one described in the first embodiment can be obtained.

Since other parts are the same as in the first embodiment, the description thereof is omitted.

According to the second embodiment, as described above, an O-shaped ohmic electrode structure can be formed using the tape lift-off method. Therefore, the step for removing the ohmic electrode 4 from the area where the via hole is formed can be eliminated, and the processing time for the manufacture of semiconductor devices can be shortened.

In the present invention, methods of forming insulating films or electrodes, or the like are not limited to the above-described methods, but other forming methods may also be used. The via-hole foundation electrode is also not limited to the via-hole foundation electrode having a barrier metal 10 containing WSi.

Third Embodiment

Figure 16:
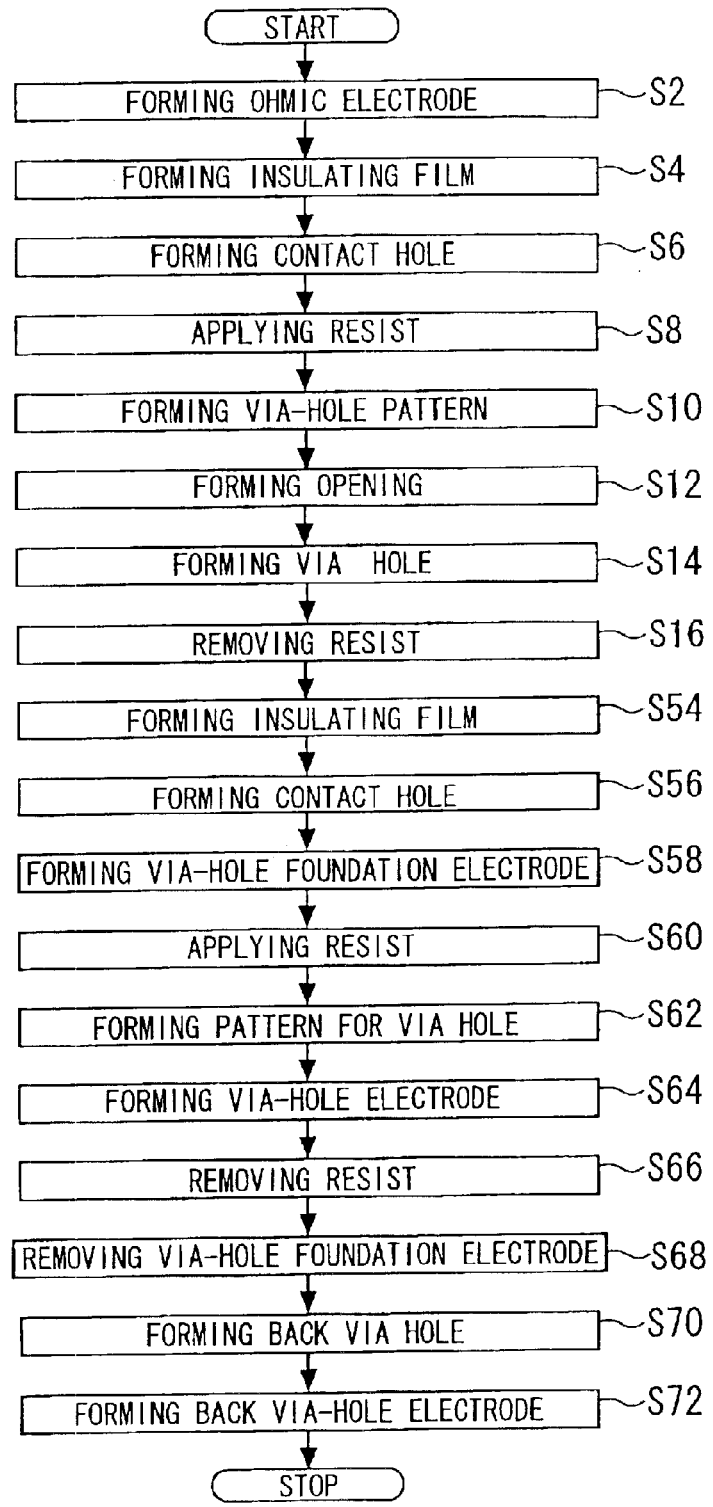
FIG. 16 is a flowchart illustrating a method of manufacturing a semiconductor device according to a third embodiment of the present invention.
Figure 17A:
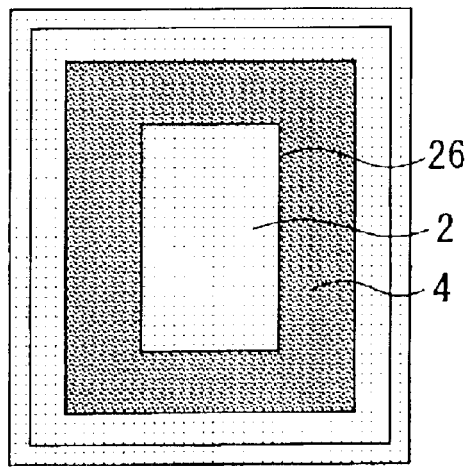
Figure 17B:
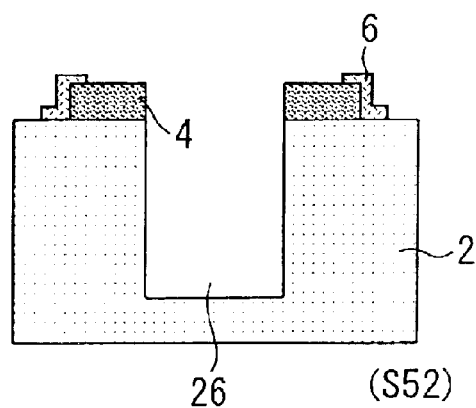

FIG. 16 is a flowchart for illustrating a method of manufacturing a semiconductor device 200 according to a third embodiment of the present invention. FIGS. 17 to 24 are schematic diagrams for illustrating the steps of the process of manufacturing the semiconductor device 200; FIGS. 17A to 24A being top views, and FIGS. 17B to 24B being sectional views.

The method of manufacturing the semiconductor device 200 will be described below referring to FIGS. 16 to 24.

First, as in the first embodiment, the formation of an ohmic electrode 4 on a semiconductor substrate 2 (Step S2); the formation of an insulating film 6 (Step S4); the formation of a contact hole 20 (Step S6); the application of a resist 8 (Step S8); the formation of a via-hole pattern 22 (Step S10); the formation of an opening in the ohmic electrode 4 (Step S12); the formation of a via hole 26 (Step S14); and the removal of the resist 8 (Step S16) are performed (FIG. 17).

Figure 18A:
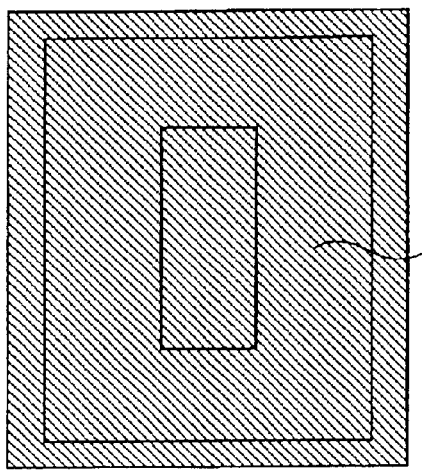
Figure 18B:
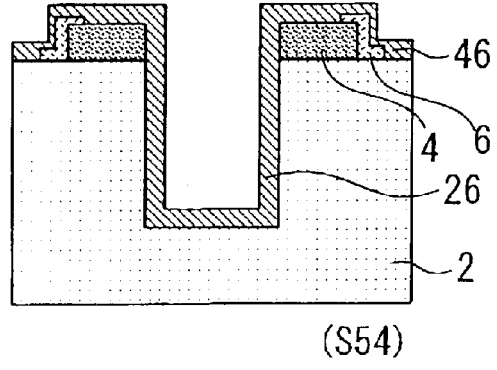
Figure 23A:
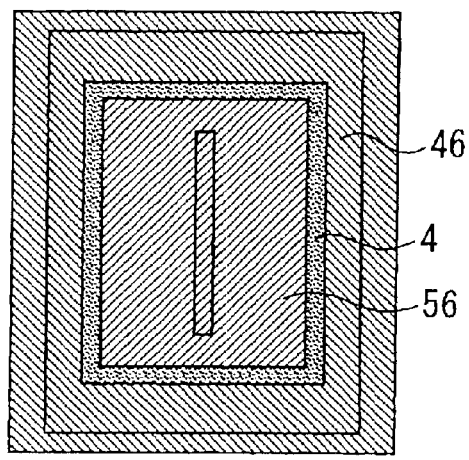
Figure 23B:
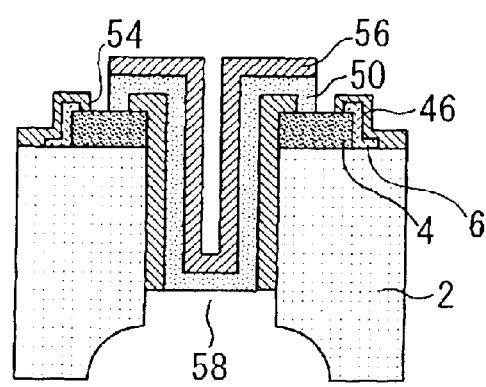
Figure 24A:
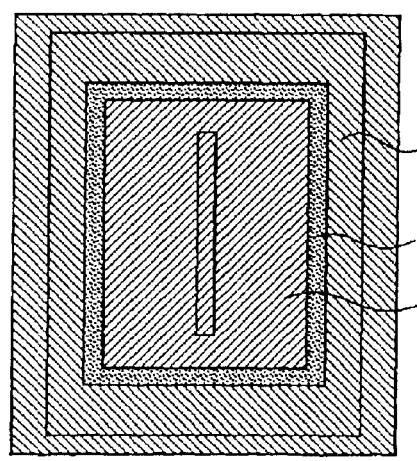
Figure 24B:
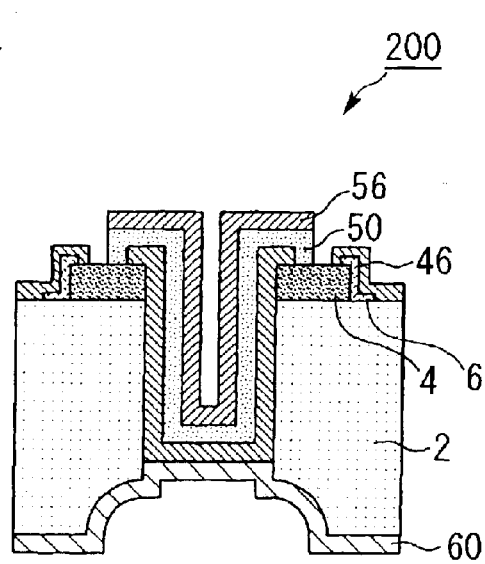
Figure 25:
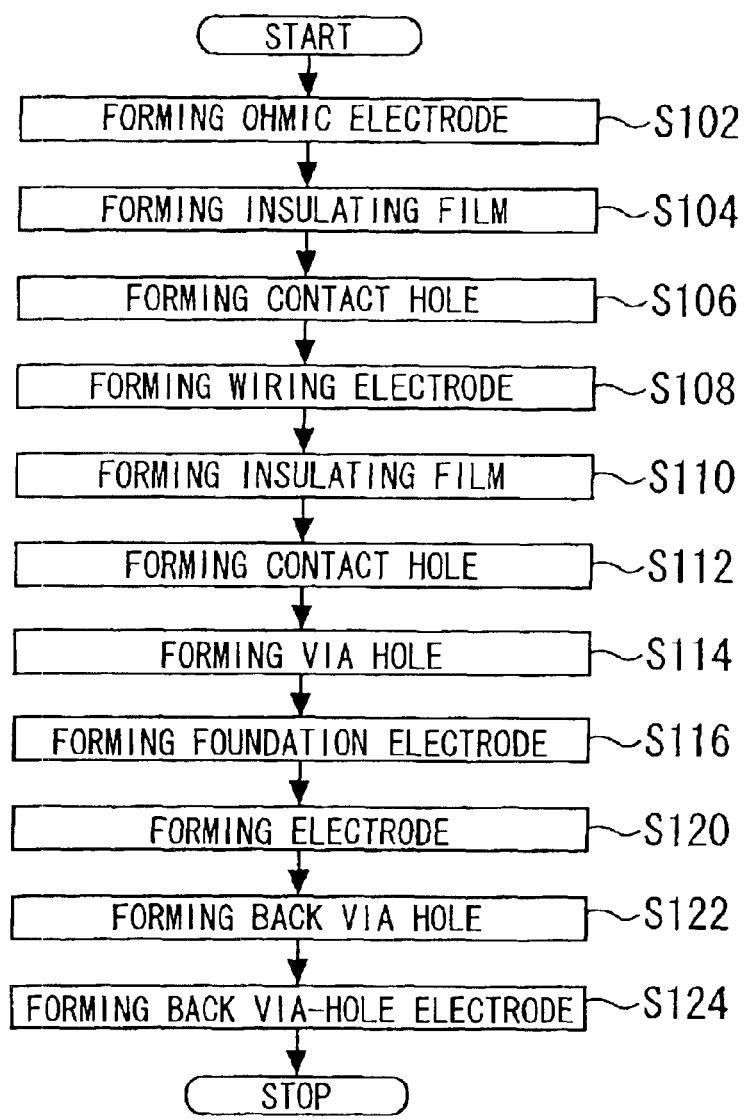
FIG. 25 is a flowchart illustrating a method of manufacturing a conventional semiconductor device.
Figure 26A:
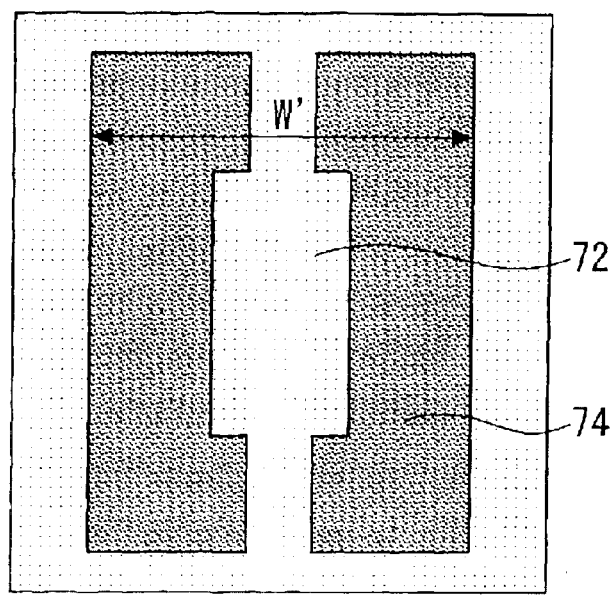
FIGS. 26A to 29B are schematic diagrams illustrating steps in a process of manufacturing the conventional semiconductor device.
Figure 26B:
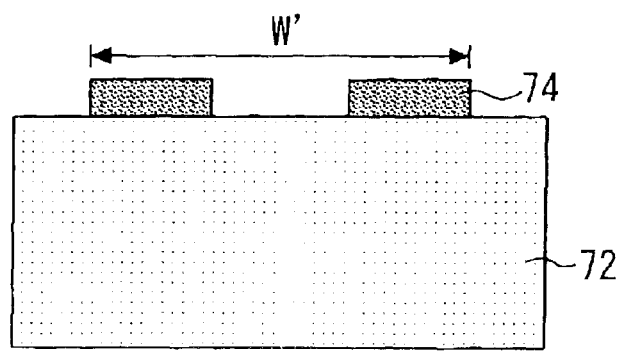
Figure 27A:
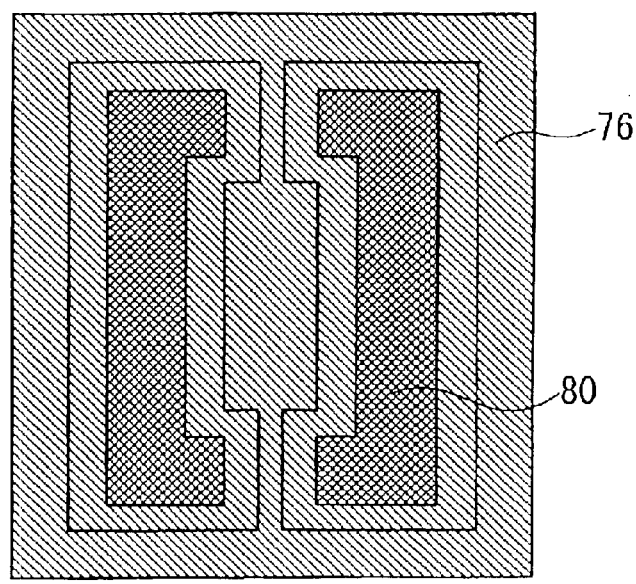
Figure 27B:
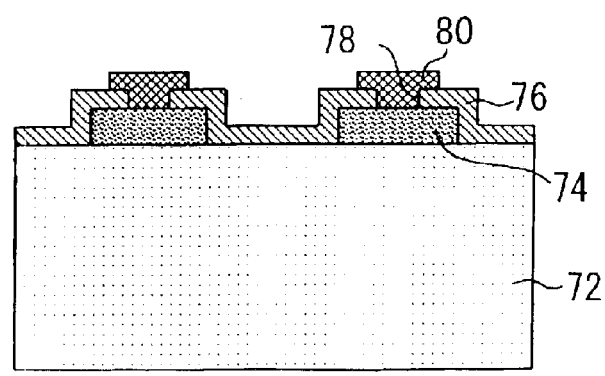
Figure 28A:
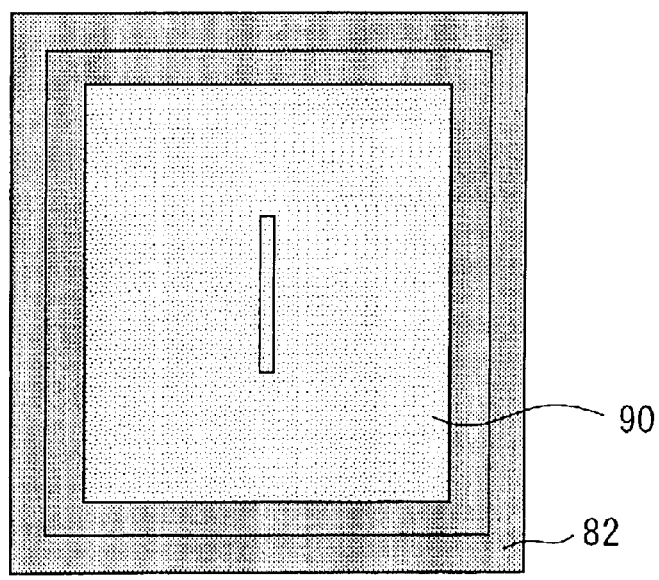
Figure 28B:
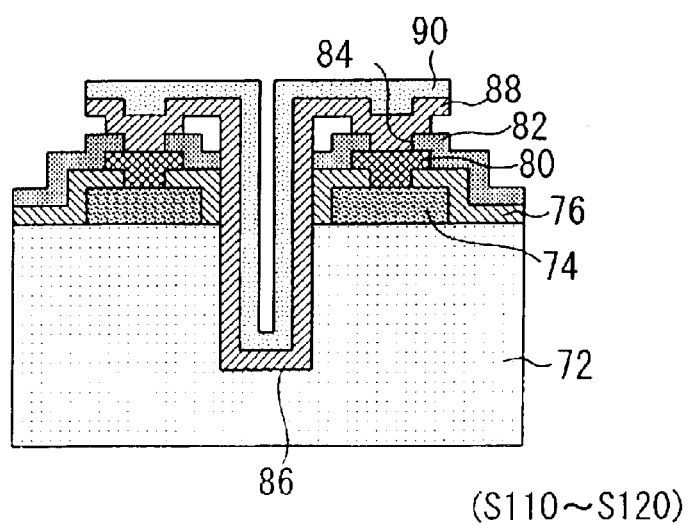
Figure 29A:
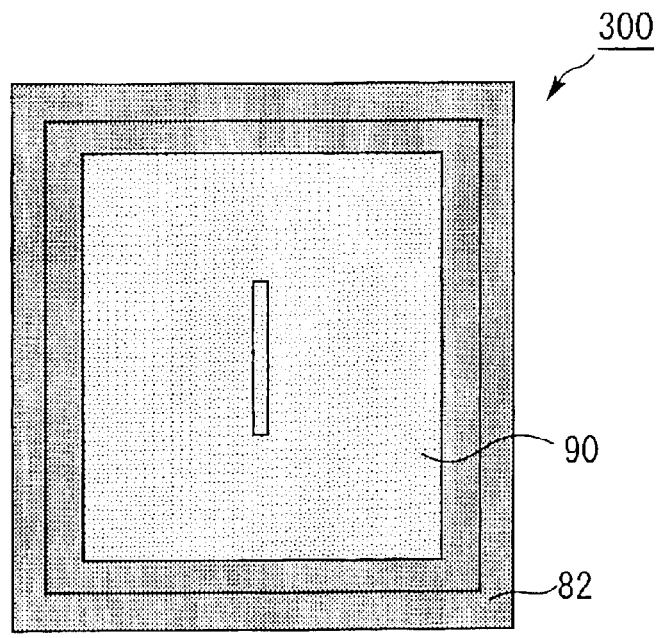
Figure 29B:
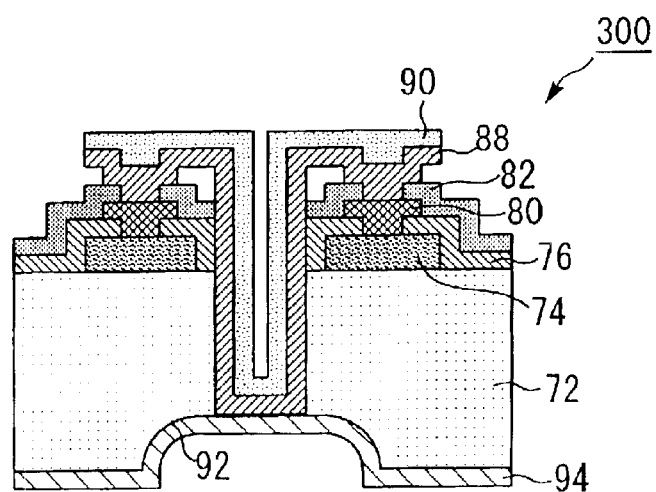

Next, as shown in FIG. 18, an insulating film 46 is formed (Step S54). Here, the insulating film 46 is formed by using the CVD method so as to cover the ohmic electrode 4 and the exposed surface of the semiconductor substrate 2 including the inner wall portion of the via hole 26.

Next, a contact hole 48 is formed (Step S56). The contact hole 48 is formed so as to open from the surface of the insulating film 46 to the ohmic electrode 4 as shown in FIG. 19.

Next, a via-hole foundation electrode 50 is formed (Step S58). Thereafter, a resist 52 is applied (Step S60); and a via-hole pattern 54 is formed on the resist 52 (Step S62). The via-hole pattern 54 is formed in a size so that the sidewall thereof is positioned above the opening 48 formed on the ohmic electrode 4 as shown in FIG. 20.

Next, a via-hole electrode 56 is formed (Step S64). Here, as shown in FIG. 21, the via-hole electrode 56 is formed on the area where the resist 52 of the via-hole foundation electrode 50 is not applied.

Next, as shown in FIG. 22, the resist 52 is removed (Step S66), and simultaneously, the via-hole foundation electrode 50 on the area where the via-hole electrode 56 is not formed, and the resist 8 are removed (Step S68).

Thereafter, a back via hole 58 is formed (Step S70). Here, the back via hole 58 is formed from the back of the semiconductor substrate 2 to the portion where the via hole 26 is formed. Next, the insulating film 46 formed on the bottom of the via hole 26 is etched off so that the via-hole foundation electrode 50 formed on the bottom of the via hole 26 is exposed on the bottom of the back via hole 58.

Next, a back via-hole electrode 60 is formed in the back via hole 58. Thus, the semiconductor device 200 as shown in FIG. 24 can be obtained.

Since other parts are the same as in the first embodiment, the description thereof is omitted.

According to the third embodiment, as described above, an insulating film intervenes between the via-hole foundation electrode in the via hole and the semiconductor substrate. Thereby, diffusion from the via-hole electrode 12 or the ohmic electrode 4 can be inhibited even if no barrier metal is formed on the via-hole foundation electrode, and the reliability of the semiconductor device can be ensured. Therefore, the range of material selection is enlarged, and the manufacturing costs can be reduced.

In the present invention, an ohmic electrode, for example as in the first to third embodiments, is suitable as the electrode. The step of forming the electrode of the present invention is implemented by performing, for example, Step S2 of the first and third embodiments, or Step S40 of the second embodiment. The step of forming the via hole of the present invention is implemented by performing, for example, Steps S8 to S16 of the first and third embodiments, or Steps S46 to S16 of the second embodiment.

The step of forming the via-hole foundation electrode having a barrier metal of the present invention is implemented by performing, for example, Steps 16 to S18 of the first and second embodiments.

The step of forming the insulating film of the present invention is implemented by performing, for example, Steps S54 to S56; and the step of forming the via-hole foundation electrode is implemented by performing, for example, Step S58 of the third embodiment.

The step of forming the via-hole electrode of the present invention is implemented by performing, for example, Steps S20 to S24 of the first and second embodiments, or Steps S60 to S64 of the third embodiment.

The step of forming the back via hole of the present invention is implemented by performing, for example, Step S32 of the first and second embodiments, or Step S70 of the third embodiment. The step of forming the back via-hole electrode of the present invention is implemented by performing, for example, Step S34 of the first and second embodiments, or Step S72 of the third embodiment.

The features and the advantages of the present invention as described above may be summarized as follows.

According to one aspect of the present invention, in the semiconductor device, there is no gap between the sidewall of the electrode and the sidewall of the via hole. Accordingly, the size of a semiconductor device can be reduced compared with the size of conventional semiconductor devices.

In another aspect, in the method of manufacturing a semiconductor device, the via hole is formed by forming an opening in the electrode and the semiconductor substrate using a mask for forming the via-hole pattern as a mask. Therefore, there is no step in the boundary of the electrode and the semiconductor substrate, and the via hole having a straight sidewall in the cross section can be formed. Therefore, the size of the via hole can be reduced by the slope formed in the via hole, and the size of a semiconductor device can be reduced.

In another aspect, when a via-hole foundation electrode having a barrier metal is used as the via-hole foundation electrode, the formation of the wiring electrode of a barrier-metal structure is not required. Therefore, the margin for the mask alignment of the via hole with the electrode can be eliminated; therefore, the lateral size of the transistor can be reduced, and the size of a semiconductor device can be reduced.

In another aspect, when an insulating film intervenes between the via-hole foundation electrode in the via hole and the semiconductor substrate, the reliability can be ensured even if no barrier metal is formed on the via-hole foundation electrode. Therefore, the range of material selection is enlarged, and the manufacturing costs can be reduced.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2002-292815, filed on Oct. 4, 2002 including specification, claims, drawings and summary, on which the Convention priority of the present application is based, are incorporated herein by reference in its entirety.

What is claimed is:

1. A semiconductor device comprising:
    a semiconductor substrate having a via hole opened to a major surface of said semiconductor substrate;
    an electrode disposed on the major surface of said semiconductor substrate, surrounding an opening of the via hole;
    a via-hole foundation electrode extending inside the via hole and contacting said electrode for inhibiting diffusion of atoms from said electrode; and
    a via-hole electrode on a surface of said via-hole foundation electrode, wherein contours of a sidewall of said electrode and a sidewall of the via hole are a straight line.

2. The semiconductor device according to claim 1, wherein said via-hole foundation electrode includes a barrier metal.

3. The semiconductor device according to claim 1, further comprising an insulating film between said via-hole foundation electrode and the sidewall of the via hole.

4. The semiconductor device according to claim 1, wherein the major surface of said semiconductor substrate is a front surface and said semiconductor substrate includes a back surface, opposite to the front surface, and a back via-hole that opens from the back surface and extends to said via-hole foundation electrode, the back via hole being larger in area at the back surface than the via-hole.

5. The semiconductor device according to claim 4, further comprising a back via-hole electrode on the back surface of said semiconductor substrate, inside the back via hole, and contacting the via-hole foundation electrode.

6. A method of manufacturing a semiconductor device comprising:
    forming an electrode on a major surface of a semiconductor substrate;
    forming a via hole by etching said semiconductor substrate, using said electrode as a part of a mask;
    forming a via-hole foundation electrode inhibiting diffusion of atoms from said electrode, inside the via hole and on said electrode;
    forming a via-hole electrode on a surface of said via-hole foundation electrode;
    forming a back via hole that opens from a back surface of said semiconductor substrate and extends to said via-hole foundation electrode on the back surface of said semiconductor substrate, the back surface being opposite the major surface; and
    forming a back via-hole electrode on the back surface of said semiconductor substrate and inside the back via hole.

7. The method of manufacturing a semiconductor device according to claim 6, wherein forming a via-hole foundation electrode includes forming a via-hole foundation electrode having a barrier metal.

8. The method of manufacturing a semiconductor device according to claim 6, further comprising, after forming the via hole and before forming said via-hole foundation electrode, forming an insulating film in the via hole and on said electrode.

* * * * *